United States Patent [19]
Sun et al.

[11] Patent Number: 5,612,249
[45] Date of Patent: Mar. 18, 1997

[54] POST-GATE LOCOS

[75] Inventors: Yu Sun, Saratoga; Yowjuang W. Liu, San Jose, both of Calif.

[73] Assignee: Advanced Micro Devices, Inc., Sunnyvale, Calif.

[21] Appl. No.: 645,844

[22] Filed: May 14, 1996

[51] Int. Cl.$^6$ .................................................. H01L 21/76
[52] U.S. Cl. ................................ 437/69; 437/70; 437/40; 437/41; 437/72
[58] Field of Search .................................. 437/69, 70, 72, 437/40 GS, 41 GS

[56] References Cited

U.S. PATENT DOCUMENTS

| | | | |
|---|---|---|---|
| 4,758,530 | 7/1988 | Schubert | 437/69 |
| 4,818,235 | 4/1989 | Chao | 437/69 |
| 5,039,625 | 8/1991 | Reisman et al. | 437/69 |
| 5,149,669 | 9/1992 | Hosaka | 437/72 |
| 5,310,692 | 5/1994 | Chan et al. | 437/41 GS |

*Primary Examiner*—Trung Dang
*Attorney, Agent, or Firm*—Foley & Lardner

[57] ABSTRACT

A method of defining a local oxidation of silicon (LOCOS) field isolation process after a poly gate is deposited. A gate oxide is grown on a silicon substrate, and then poly or amorphous silicon is deposited. A thin layer of PECVD or LPCVD oxide is deposited on the poly, and LPCVD nitride is then deposited as a hard mask. A device active area is defined by photoresist mask and plasma etch. The layers may either be etched down to the silicon surface, or the silicon surface may be further etched to create a recessed silicon region.

An oxide layer is grown on the exposed sidewalls of the poly, and another layer of nitride is deposited. The nitride is etched to form a nitride spacer, and a field oxide is grown. A field isolation implant is formed, followed by stripping the nitride space. The oxide layer is removed, reexposing the poly. Another layer of poly and WSi film is deposited, and gate and interconnects are defined by applying a gate mask and etch. An alternate approach of self-aligned silicide gate, junction and interconnect can be formed without using WSi by depositing Ti after the gate is defined. N-LDD and P-LDD implants are performed by masks, followed by an oxide spacer being formed. N+ and p+ junctions are then formed by separate masks and implants.

18 Claims, 15 Drawing Sheets

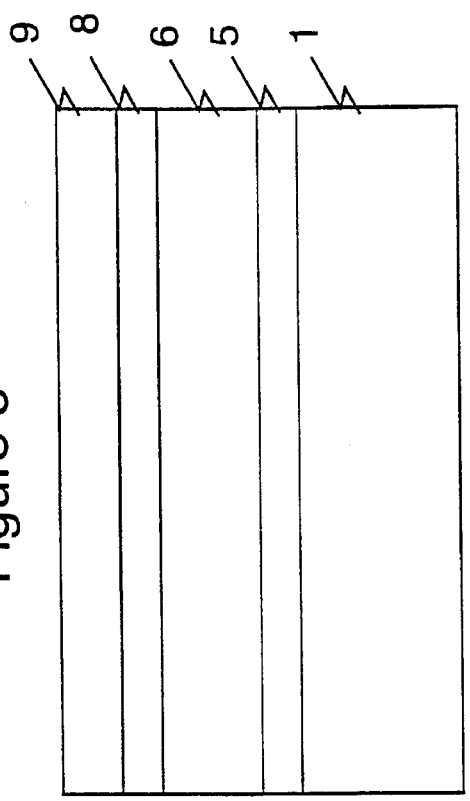
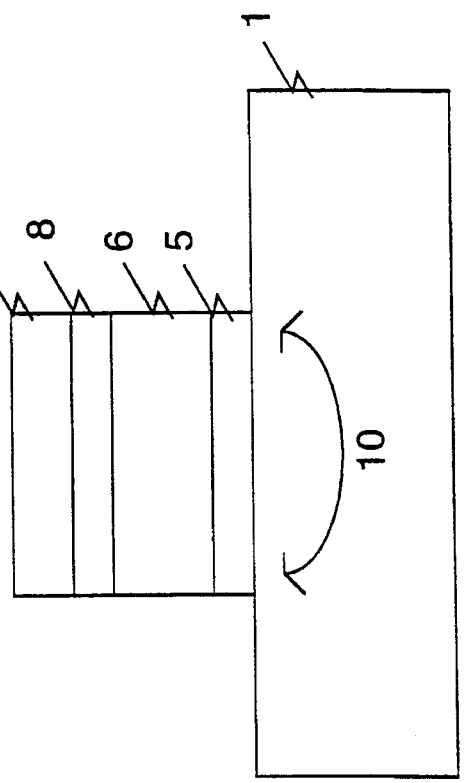

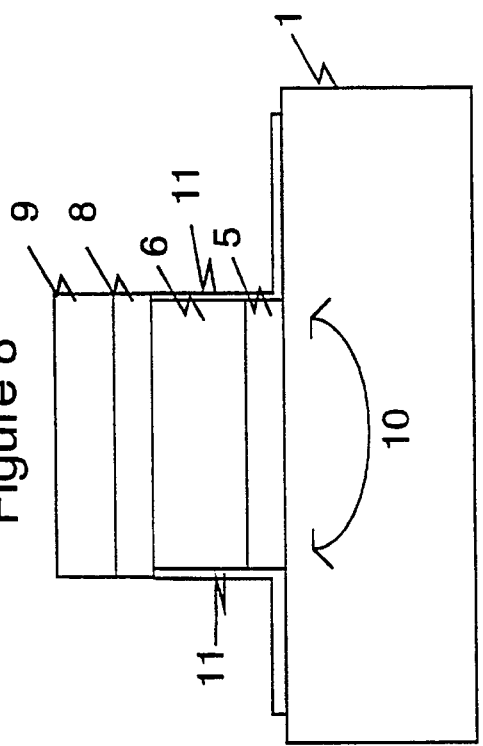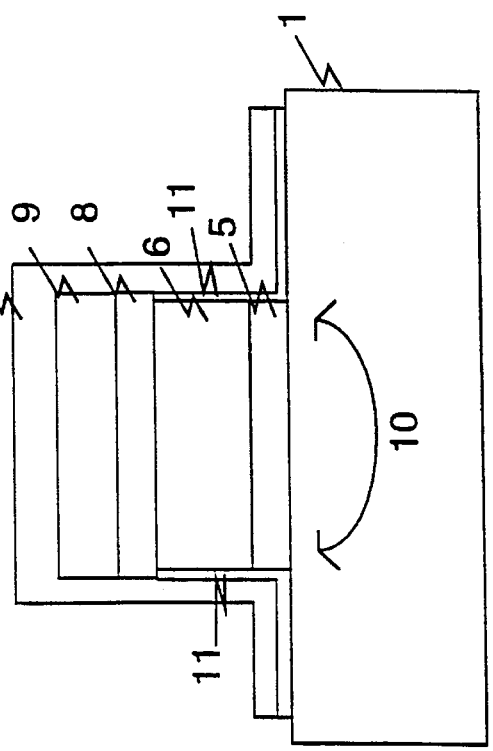

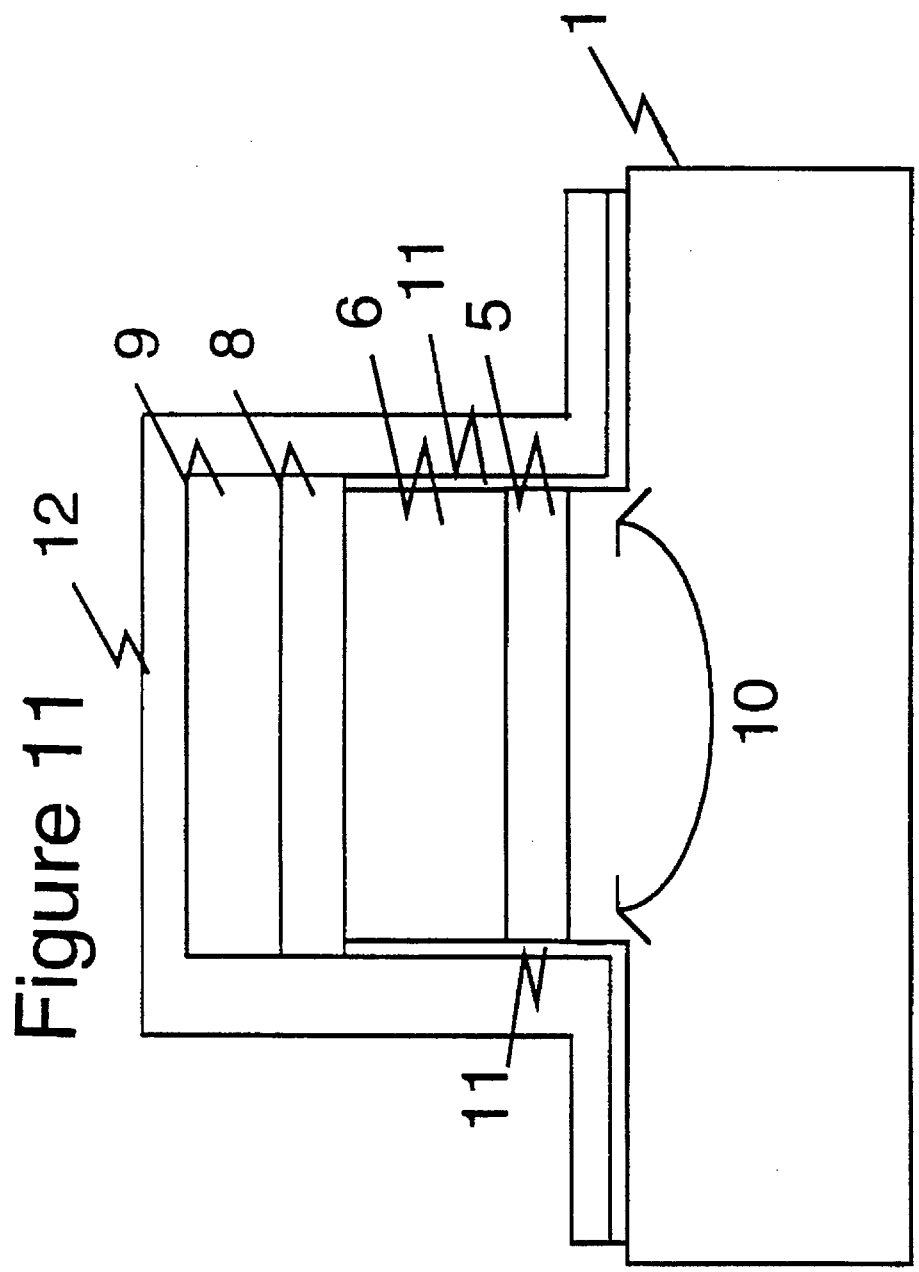

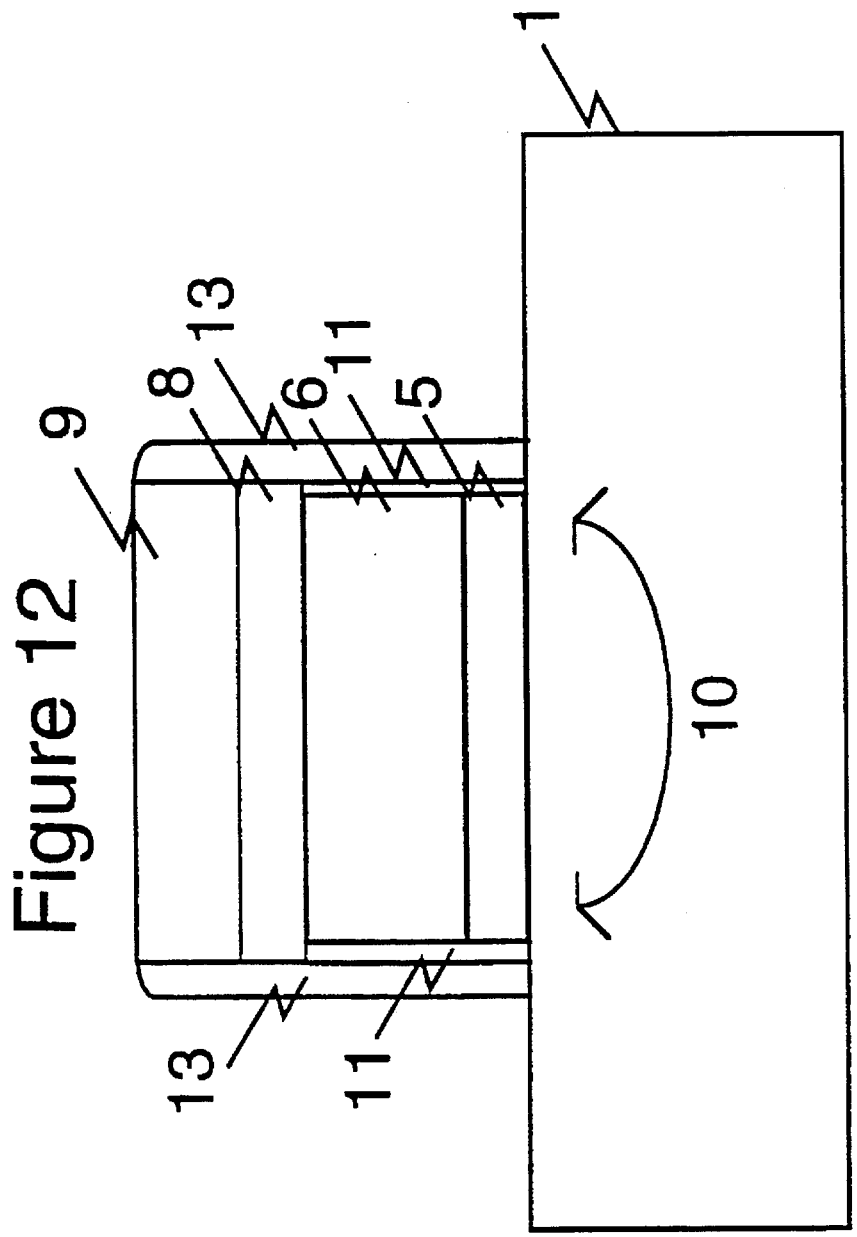

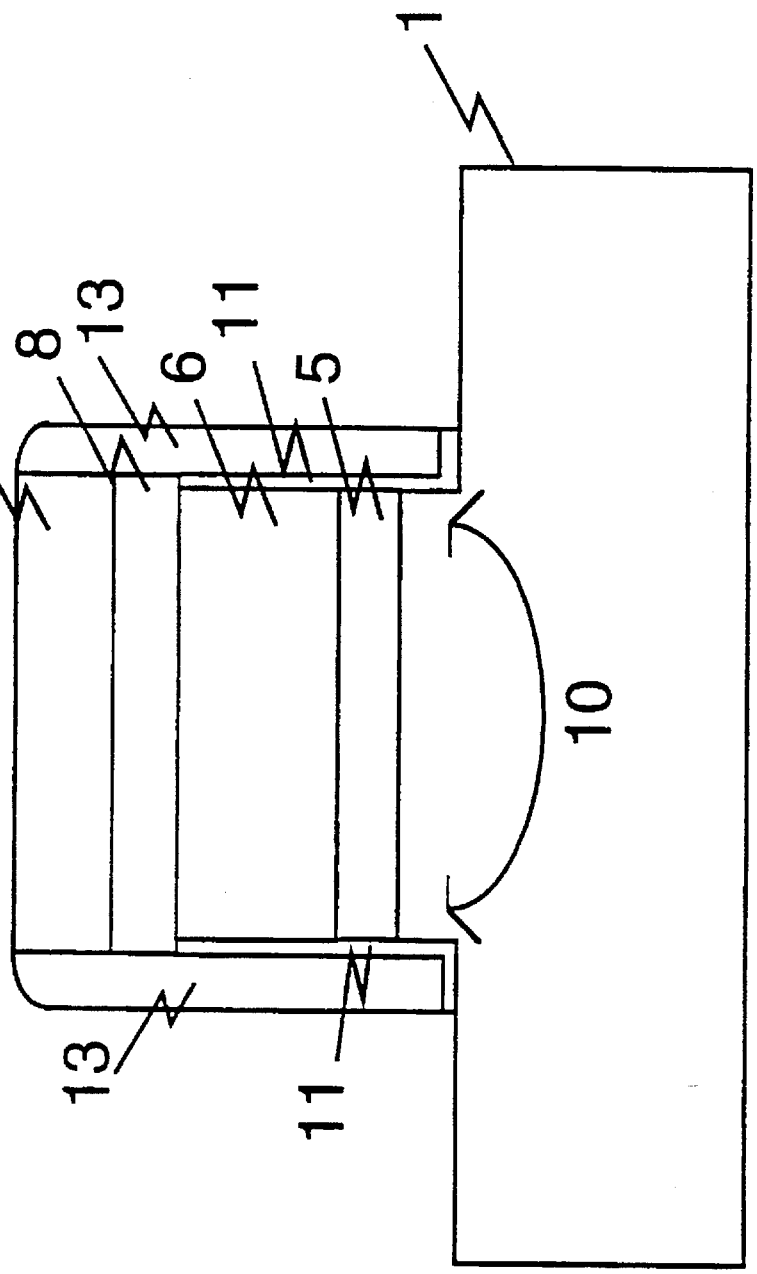

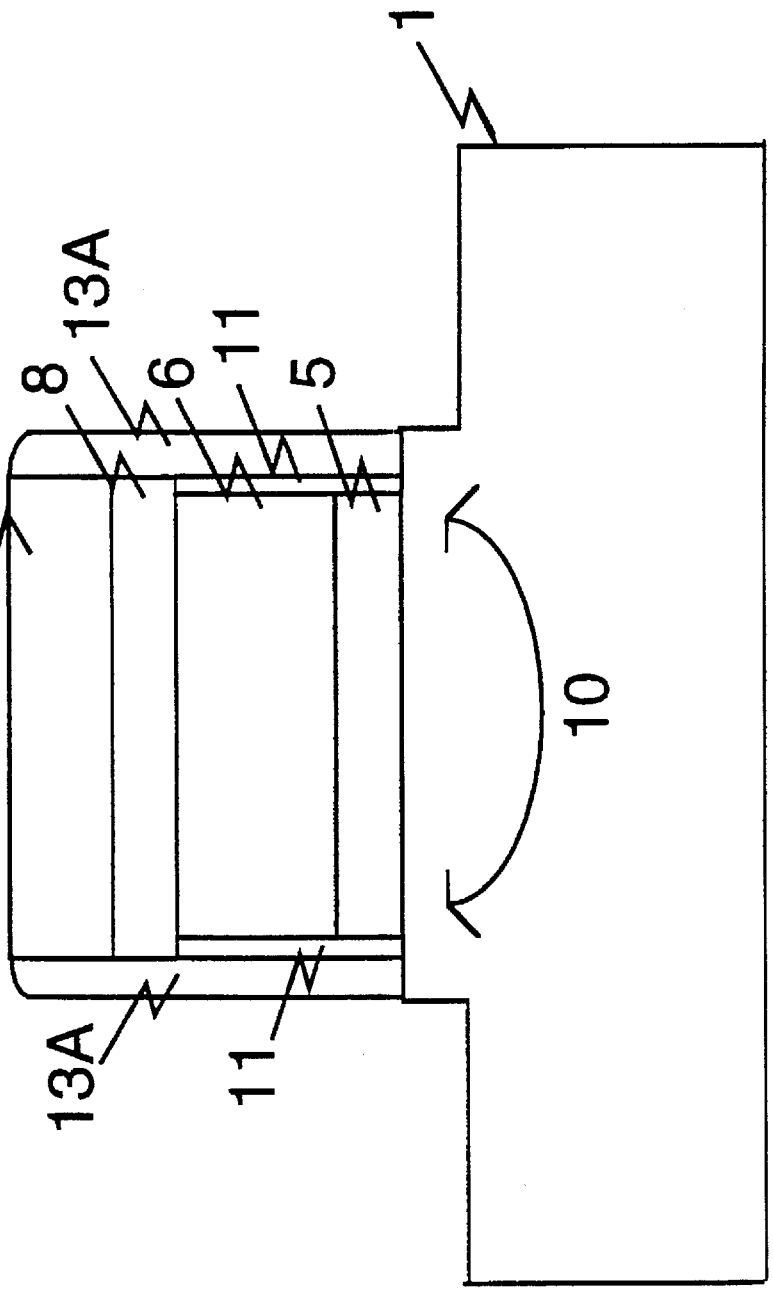

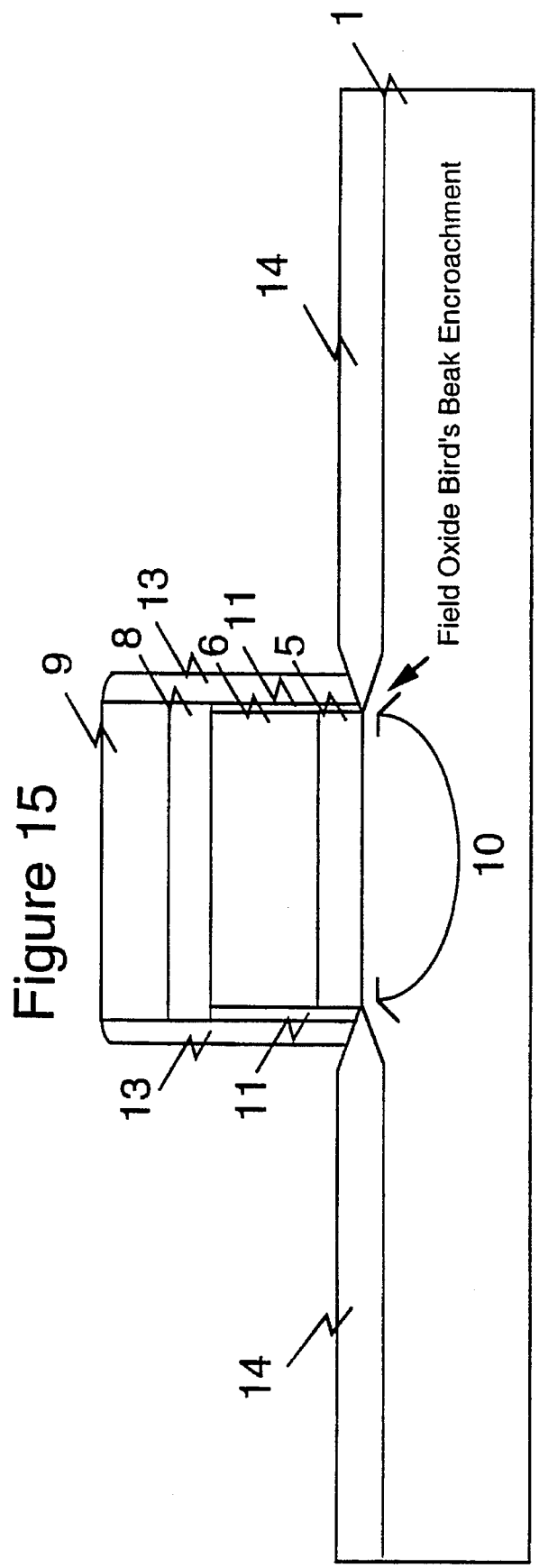

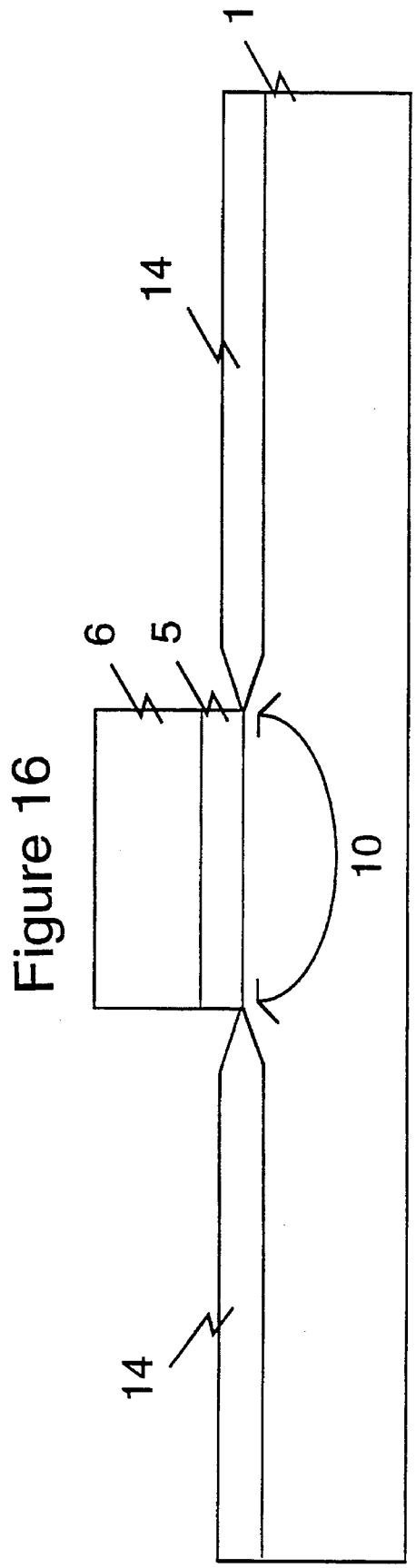

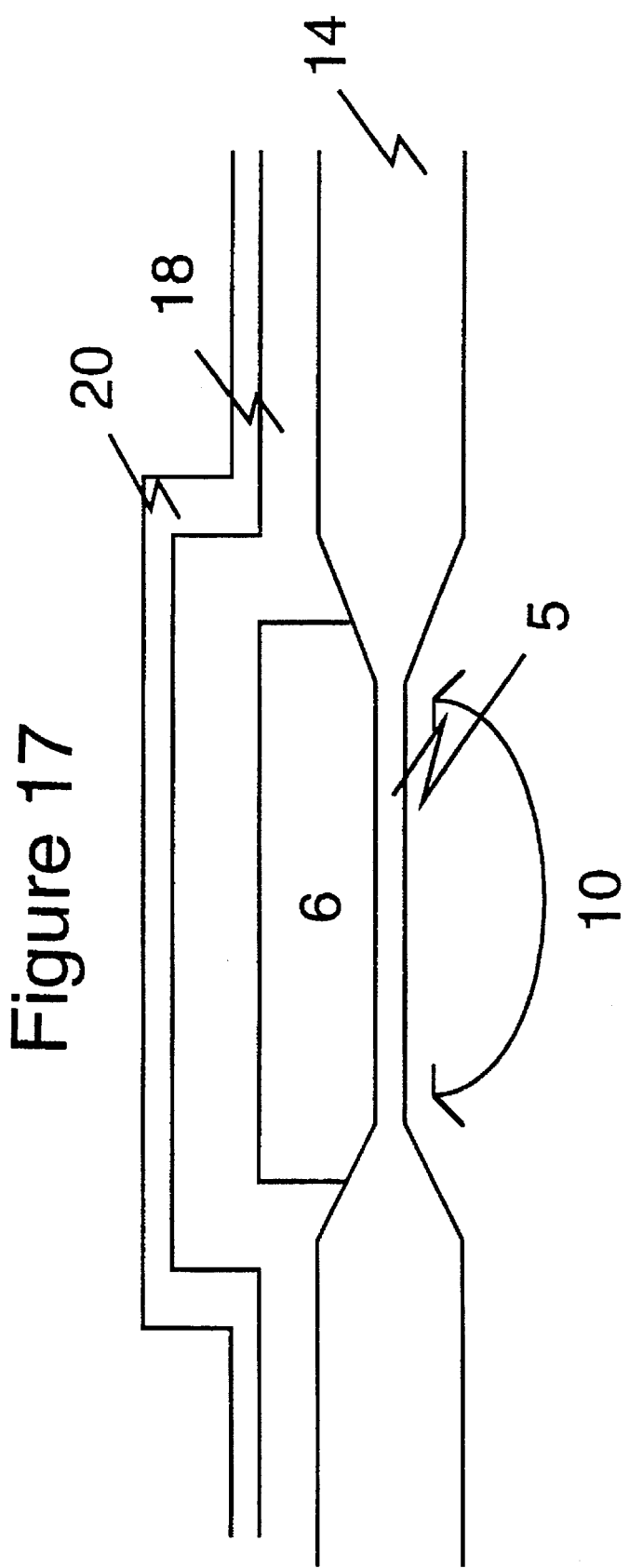

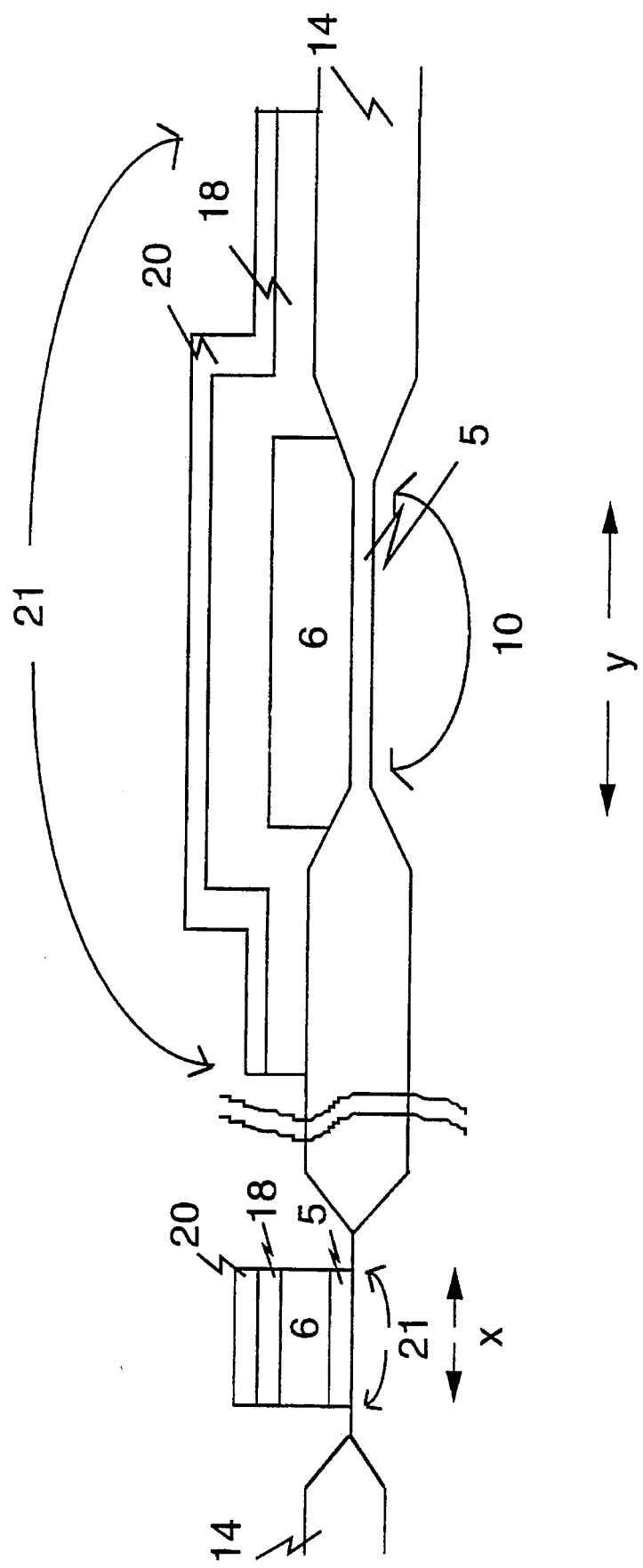

POST-GATE LOCOS

BACKGROUND OF THE INVENTION

1. Field of the Invention

The invention relates to a method for performing local oxidation of silicon (LOCOS) after a poly or amorphous gate is deposited on a silicon substrate.

2. Description of the Related Art

Fabrication of large scale integration (LSI) and very large scale integration (VLSI) on silicon (Si) substrates requires extreme crystalline perfection of the silicon. Several methods currently exist for obtaining such extreme crystalline perfection, including Czochralski (CZ) crystalline growth and float zone (FZ) growth, described in Silicon Processing for the VLSI Era, Volumes I, II, and III, by S. Wolf and R. N. Tauber (Lattice Press 1986), which is incorporated herein by reference. In the CZ method, single crystal ingots are pulled from molten silicon contained in a crucible. CZ growth involves the crystalline solidification of atoms from a liquid phase at an interface. In the FZ method, a molten zone is passed through a poly-Si rod of approximately the same dimensions as the final ingot. CZ crystals are preferred for VLSI design over FZ crystals, since they can withstand thermal stress better than FZ crystals. However, FZ crystals can obtain higher purity over CZ crystals.

After the ingot is obtained, the finished silicon wafer is achieved by the processes of slicing, etching and polishing the ingot, as described in the Wolf and Tauber reference.

The formation of oxide on silicon, thereby forming $SiO_2$, or silicon dioxide, is called oxidation. The formation of the oxide layer provides a foundation for planar processing of silicon integrated circuits. The most common way to produce $SiO_2$ on the silicon surface is by thermal oxidation, in which the silicon is exposed to an oxidizing ambient ($O_2$, $H_2O$) at elevated temperatures. Other techniques used to grow $SiO_2$ on silicon include plasma anodization and wet anodization.

The use of a $SiO_2$ layer on silicon is important for LSI and VLSI processing. Some of the functions of this layer include: a) masking against ion implantation, b) passivation of the silicon surface, c) isolation of individual devices (e.g., local oxidation of silicon, or LOCOS), d) use as a gate oxide and capacitor dielectric in MOS devices, and e) use as a tunneling oxide in electrically alterable ROMS (EAROMs).

One of the most important applications of oxidation to LSI and VLSI processing is the formation of a gate-dielectric for MOS transistors. In this situation, the $SiO_2$ layer is an active device component. Currently, device dimensions are getting smaller and smaller, and for device dimensions that are scaled to one micron or less, oxide layers of 150 angstroms or less are required. Tunnel oxides for use in EAROMs require oxides that are thinner than 100 angstroms. These thin oxide layers must be capable of being manufactured with high yield and with long-term reliability.

Many techniques are available to control the growth of thin oxides on silicon. These include: a) dry oxidation, b) wet oxidation, c) dry or wet oxidation with HCL, trichloroethylene (TCE), or trichloroethane (TCA), d) reduced pressure oxidation, e) low temperature, high pressure oxidation, and f) rapid thermal processing under oxidizing conditions.

LSI and VLSI devices requires gate and tunnel dielectric thicknesses in the range of 100 angstroms or less. Very thin layers of $SiO_2$ are known to have relatively high defect densities, and do not serve as an effective diffusion mask against impurity diffusion. As a consequence, thermal nitridation of silicon and thin $SiO_2$ is a viable alternative method of growing a good quality dielectric film that has a very small thickness. Thermally grown films of silicon nitride ($Si_3N_4$) have the following advantages over $SiO_2$: a) they tend to have self-limiting growth kinetics which makes them easily controllable, and b) they are effective barriers to impurity diffusion.

Thermally grown silicon nitride films are typically grown by a high temperature (950–1200 degrees C.) nitridation of silicon in pure ammonia ($NH_3$) or an ammonia plasma. Other techniques are also available to grown silicon nitride films, including using direct nitrogen implantation at a high dosage (e.g, $5\times10^{16}$ $cm^{-2}$) and at a high energy range (e.g., 5–60 keV), followed by an anneal at high temperature (1000 degrees C.) in an $N_2$ ambient.

Various dopants, such as boron, phosphorous, gallium, aluminum, arsenic and antimony, are used to enhance the oxidation rate when present in high concentration in silicon. For diffusion limited oxidations, the oxidation rate of the heavily doped silicon is primarily dependent on the impurity concentration in the $SiO_2$.

$SiO_2$ can also be used as a mask against the diffusion of the common dopants in silicon. Devices are typically formed by etching windows in selected areas of the $SiO_2$ grown on the silicon. Junctions are then formed by diffusing or ion implanting impurities into these selected regions.

Chemical vapor deposited (CVD) $SiO_2$ films, and their binary and ternary silicates, are widely used in LSI and VLSI processing. These materials are typically used as insulators between polysilicon and metal layers, between metal layers in multilevel metal systems, as getters, as diffusion sources, and as final passivation layers. CVD silicon dioxide is an amorphous structure of $SiO_4$ tetrahedra with an empirical formula $SiO_2$. Deposition of CVD $SiO_2$ at high temperatures can make the properties of CVD films approach those of thermal oxide.

Polycrystalline silicon (also called polysilicon, or poly), in thin film has many important advantages in integrated circuit (IC) technology. Heavily-doped poly films have been widely used as gate electrodes and interconnections in MOS circuits. Poly is utilized in these circuits because of its compatibility with subsequent high temperature processing, its excellent interface with $SiO_2$, and its high reliability.

Thin films of poly are made up of small (on the order of 100 angstroms), single crystal regions, separated by grain boundaries. The grain boundaries are composed of disordered atoms, and contain large numbers of defects due to incomplete bonding. Inside each grain, atoms are arranged in a periodic structure. At a given dopant concentration, poly exhibits significantly higher resistivity than single crystal silicon. Poly is generally deposited by a thermal decomposition of silane ($SiH_4$) in a temperature range of 580 to 650 degrees C. The main technique used to deposit poly is by low pressure chemical vapor deposition (LPCVD), because of its uniformity and purity.

Traditionally, local oxidation of silicon (LOCOS) is formed before growing a gate oxide on a silicon substrate. The inventor has determined that is desirable to form the LOCOS after growing the gate oxide on the silicon substrate, in order to provide a more reliable and efficient semiconductor device.

SUMMARY OF THE INVENTION

An object of the instant invention is to create a more reliable and efficient semiconductor device by forming local oxidation of silicon regions after growing a gate oxide layer on a silicon substrate.

These and other objects can be achieved by a method of fabricating an integrated circuit semiconductor device having a plurality of field effect transistors (FETs) in and on a silicon substrate with local oxidation of silicon (LOCOS) as field oxide isolating regions between the FETs. The method includes a step of forming a gate oxide layer on a top surface of the substrate. The method also includes a step of forming a polysilicon layer on the gate oxide layer. The method further includes a step of etching the gate oxide layer and the polysilicon layer to form gate structures for the FETs. The method still further includes a step of surrounding the gate structures with an oxidation mask. The method includes an optional step of etching areas of the top surface of the substrate which do not include the gate structures of the FETs in order to remove the oxidation mask on the etched areas. The method further includes a step of forming the LOCOS field oxide isolation regions by growing an oxide layer between the FETs.

These and other objects can also be achieved by a method of fabricating an integrated circuit semiconductor device having a plurality of field effect transistors (FETs) in and on a silicon substrate with local oxidation of silicon (LOCOS) as field oxide isolating regions between the FETs. The method includes a step of forming a gate oxide layer on a top surface of the substrate. The method also includes a step of forming a polysilicon layer on the gate oxide layer. The method further includes a step of etching the gate oxide layer and the polysilicon layer to form gate structures for the FETs. The method also includes an optional step of etching areas of the top surface of the substrate which do not include the gate structures of the FETs such that the substrate is thicker underneath the gate structures for the FETs than it is at other areas of the substrate. The method still further includes a step of surrounding the gate structures with an oxidation mask. The method also includes a step of forming the LOCOS field oxide isolation regions by growing an oxide layer between the FETs.

BRIEF DESCRIPTION OF THE DRAWINGS

These and other objects and advantages of the invention will become more fully apparent from the following description when read in conjunction with the accompanying drawings, with like reference numerals indicating corresponding parts throughout, wherein:

FIG. 5 shows the nitride layer after it is deposited on the oxide layer in the ninth step in the method of the instant invention;

FIG. 6 shows the active gate region in the silicon substrate after the tenth step in the method of the instant invention;

FIG. 8 shows the oxide layer used to cover the poly or amorphous layer for the non-recessed LOCOS in the method of the instant invention;

FIG. 10 shows the nitride layer used to create the nitride spacer for the non-recessed LOCOS in the method of the instant invention;

FIG. 11 shows the nitride layer used to create the nitride spacer for the recessed LOCOS in the method of the instant invention;

FIG. 12 shows the nitride spacer created from the nitride layer for the non-recessed LOCOS in the method of the instant invention;

FIG. 13 shows the nitride spacer created from the nitride layer for the recessed LOCOS in the method of the instant invention;

FIG. 14 shows the nitride spacer created from the nitride layer for the recessed LOCOS after poly etch in the method of the instant invention;

FIG. 15 shows the field oxide layer after it is deposited in the fourteenth step in the method of the instant invention;

FIG. 16 shows the exposed gate after the nitride layer, nitride spacer and oxide layer have been stripped/etched after the sixteenth and seventeenth steps in the method of the instant invention;

FIG. 17 shows the additional layer of poly or amorphous silicon added after the twentieth step in the method of the instant invention;

FIG. 18 shows both an x-direction cross section of the gate material sandwich and a y-direction cross section of the gate interconnect sandwich formed after the twentyfirst step in the method of the instant invention;

DETAILED DESCRIPTION OF THE PREFERRED EMBODIMENTS

The method as described hereinbelow provides a local oxidation of silicon (LOCOS) field isolation process that is formed after a poly gate is deposited on a silicon substrate. This post-gate LOCOS process can be applied to logic circuits and to memory circuits.

Figure 1:
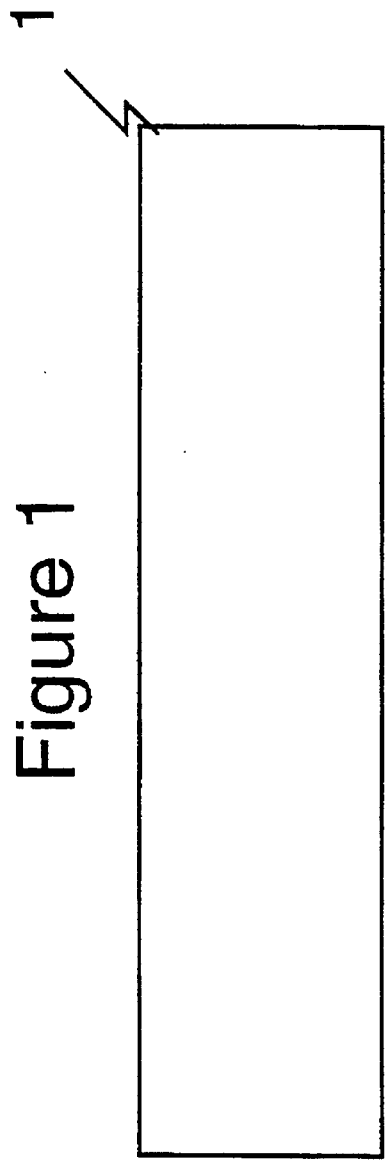
FIG. 1 shows a silicon substrate that is used in the method of the instant invention.

Initially, in a first step (step 1), a starter material is required as a substrate. The starter material may be either n-type or p-type, epitaxal or non-epitaxal. This starter material is shown as area 1 on FIG. 1. Next, in a second step (step 2), an initial oxidation, or pre-oxidation, is performed for surface treatment of the substrate. The oxide can be used as a screening oxide for subsequent implant steps. This second step is an optional step. The initial oxidation creates a "denuded zone" in the silicon substrate, where oxygen that exists in the silicon substrate is driven out of the denuded zone, thereby lessening the possibility of defects in the denuded zone due to oxides being purged from that zone. The denuded zone is typically 20 to 40 microns deep.

Next, in a third step (step 3), wells are formed by masks, implants, and drives, if they are required in the process. For the formation of an n-channel or a p-channel transistor, the formation of an n-well or a p-well is respectively required. To form such a well, one needs to perform a masking, an implant, and then drive (i.e., create) the well. Such techniques are known in the art, are will not be explained in any great detail in order to simplify the explanation of the method according to the invention. Also, while the description given herein is for a formation of a CMOS field effect transistor (FET), the method according to the invention can apply equally as well to other types of FETs, such as an NMOS or PMOS FET.

Next, in a fourth step (step 4), field isolation implants are formed by masks and implants. This is needed to enhance the isolation of the device (i.e, MOS transistor) that is being formed. This step can be processed together with the formation of the well implants in the third step if there are no significant thermal cycles of well drive. Also, these steps can be processed at a later stage when the post-gate field isolation LOCOS is formed.

The formation of field isolation implants is performed in the fourth step so that adjacent, similar transistors are isolated from each other. For example, for two adjacent n-channel transistors being formed on the same substrate, a field isolation implant of a p-type is required between these two devices so as to provide the required electrical isolation between these devices.

Figure 2:
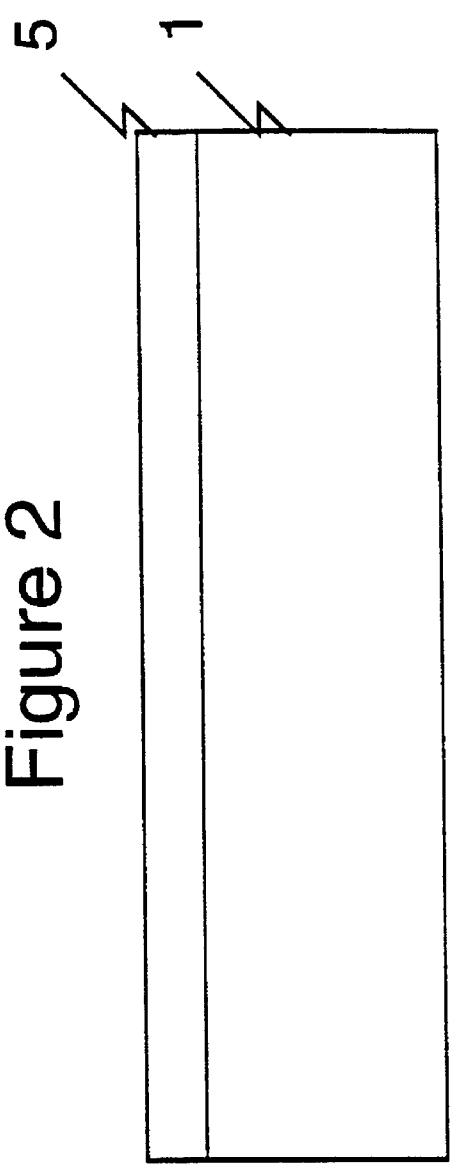
FIG. 2 shows the gate oxide layer after it is deposited in the fifth step in the method of the instant invention.

Next, in a fifth step (step 5), a gate oxide or tunnel oxide is grown on the substrate. Preferably, a wet chemical clean is used to remove any oxide on the silicon substrate 1 before this oxidation step. The gate oxide or tunnel oxide is shown as oxide layer 5 in FIG. 2. The oxide layer 5 is grown over the entire silicon substrate 1. The oxide layer 5 is preferably in the range of between 40 angstroms and 150 angstroms in depth. Sub-micron transistors require thinner oxides, and so this oxide layer may be even thinner as devices get smaller in the future.

Figure 3:
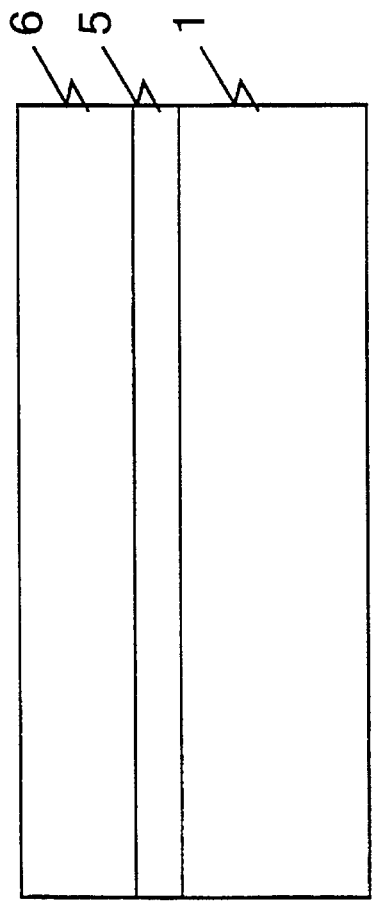
FIG. 3 shows the poly or amorphous silicon layer after it is deposited on the gate oxide layer in the sixth step in the method of the instant invention.

Next, in a sixth step (step 6), poly or amorphous silicon is deposited as a gate material over the oxide layer 5 on the silicon surface 1. The poly or amorphous silicon layer is shown as layer 6 in FIG. 3.

Next, in a seventh step (step 7), if only a n-type or a p-type gate material is required for devices on the substrate, the poly or amorphous silicon can be doped insituly with the deposition process of the previous step, or it can be done by a separate n-type (or p-type) doping process, such as by implant or diffusion. If both n and p types of gate material are required, they can be doped by masks and implants. These n and p implant steps can be done at this time, or they can be done at a later stage to simplify processing steps.

The procedure of simultaneously depositing a material and doping the material is called "insituly". The doping can be performed by phosphorous or boron, for example. The doping of the poly layer is not shown in FIG. 3, but it acts to dope the layer 6.

Figure 4:
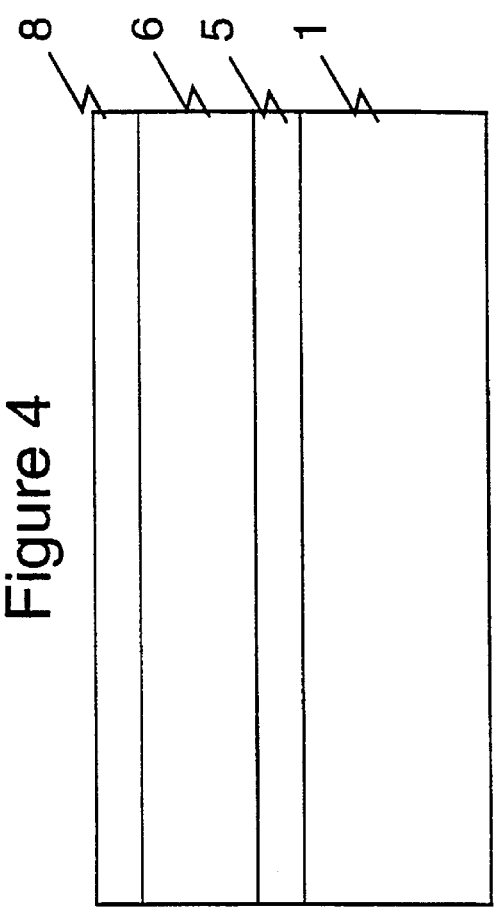
FIG. 4 shows the oxide layer after it is deposited on the poly or amorphous layer in the eighth step in the method of the instant invention.

Next, in an eighth step (step 8), a thin layer of PECVD or LPCVD oxide is deposited on the poly or amorphous gate. The thin layer is shown as oxide layer 8 in FIG. 4, and it acts as a buffered oxide. Note that, as of this point, each of the layers 5, 6, and 8 has been deposited without any patterning, that is, they are flat layers on top of each other.

A ninth step (step 9) involves depositing LPCVD nitride as a hard mask, and this is shown as layer 9 is FIG. 5. The LPCVD nitride layer 9 is used to prevent the poly or amorphous gate 6 from being oxidized during the field oxidation (at a later step). The nitride layer 9 also serves as a buffered layer for a nitride spacer etch that will be performed at a later step. By virtue of the nitride layer 9, the nitride spacer etch will stop on the nitride layer 9, without etching down to the CVD oxide layer 8.

Next, in a tenth step (step 10), a device active area (including the gate and source and drain areas) is defined by a photoresist mask and a plasma etch. This etch selectively removes the nitride/CVD oxide/poly or amorphous silicon from portions of the silicon substrate 1, and the etch stops on the gate oxide or tunnel oxide layer 5. By virtue of the etching performed in this tenth step, a gate region 10 as shown in FIG. 6 is defined. Note that the layers 5, 6, 8, and 9 have been etched outside of the gate region 10 during this step.

Figure 7:
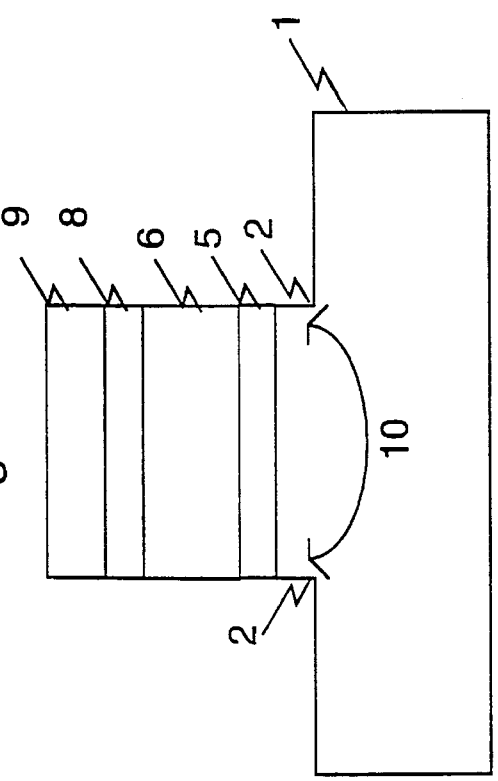
FIG. 7 shows the recessed silicon in the alternate step 10A in the method of the instant invention.

FIG. 6 shows the etching being done down to the silicon surface 1, and no further. However, as an alternative step 10a (instead of step 10), the etching may be performed to include part of the silicon surface 1. In FIG. 7, there is shown a step region 2 that is a result of the recessed silicon caused by the further etching done in the step 10a. Thus, in this alternative step 10a, the etching does not stop at the oxide layer 5, but proceeds into the silicon surface 1. The advantage of the alternative step 10a as shown in FIG. 7 is that it provides a planar surface after field oxidation is later performed. In other words, when the oxide is grown on the silicon, the silicon changes to silicon dioxide ($SiO_2$), and thus its thickness increases. With the recessed area as shown in FIG. 7, the oxidized silicon pushes up to it original level around the gate region 10.

An eleventh step (step 11) involves growing a thin layer of oxide at the exposed edge (sidewall) of the poly or amorphous silicon layer 6. This is shown as layer 11 in FIG. 8, which corresponds to the substrate structure if the step 10 was previously performed. The oxide layer 11 acts as a buffer oxide between a future nitride spacer and the poly or amorphous silicon layer 6. Further, the oxide layer 11 increases the residual gate oxide or tunnel oxide thickness. The oxide layer 11 grows on the poly 6 and on the exposed silicon surface 1, as clearly seen from FIG. 8.

Figure 9:
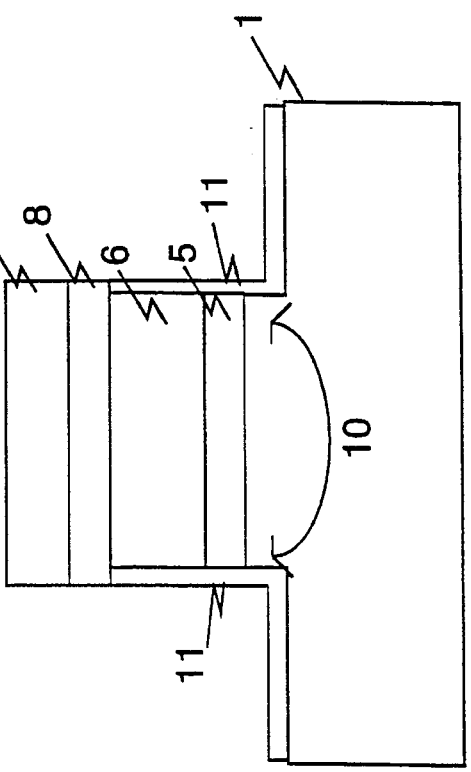
FIG. 9 shows the oxide layer used to cover the poly or amorphous layer for the recessed LOCOS in the method of the instant invention.

If, however, the recessed silicon has been performed by virtue of previously performing step 10a instead of step 10, then, in the eleventh step, the oxide layer 11 is grown on the regions as shown in FIG. 9. Note that the oxide layer 11 grows on the step region 2 that is formed due to the recessed nature of the silicon surface as created in step 10a.

A twelfth step (step 12) is used to deposit another layer of nitride for the purpose of later forming a nitride spacer. This layer is shown as nitride layer 12 in FIGS. 10 and 11. FIG. 10 shows the nitride layer 12 deposited on the non-recessed silicon substrate, and FIG. 11 shows the nitride layer deposited on the recessed silicon substrate.

A thirteenth step is used to form a nitride spacer by plasma nitride etch. In the active area, this etch stops on the buffer nitride layer 9. The nitride spacer is shown as nitride spacer 13 in FIG. 12 for the non-recessed silicon substrate, and it is shown as nitride spacer 13 in FIG. 13 for the recessed silicon substrate. In the field isolation area, the etching performed during this step will stop on the residual gate oxide or silicon for the non-recessed LOCOS approach, or it can stop on the silicon for the recessed LOCOS approach. For either the non-recessed or the recessed LOCOS approach, at this time, the sidewall of the poly or amorphous silicon 6 is sealed by the nitride spacer 13. The nitride spacer 13 not only prevents the sidewall from oxidizing, but it also offsets the oxide encroachment (commonly known as "bird's beak") under the active area during the field oxidation.

If there is no recessed silicon formed before the nitride spacer 13 has been etched in the previous step (see FIG. 12), then there is another opportunity to form the recessed silicon for the recessed LOCOS approach. During the nitride spacer etching step, the silicon can be further etched down in a step 13A to form a silicon step region below the original silicon surface when the nitride 12 and residual oxide 11 are removed in the field isolation area. However, the thickness of the buffered nitride 9 has to be increased in order to accommodate the silicon etch. In this recessed LOCOS approach, the recessed silicon step will not be covered by the nitride spacer 13A, as seen in FIG. 14. In the other recessed LOCOS approach, the recessed silicon step is sealed by the nitride spacer 13 and the sidewall oxide 11, as seen in FIG. 13.

A fourteenth step (step 14) is used to grow the field oxide. The field oxide is grown wherever the silicon surface is exposed. The field oxidation is preferably grown by dry oxidation, which avoids the concerns of nitrodized silicon at the interface of the field and active areas (commonly named "Kooi ribbon") caused by the reactions of hydrogen (from steam), nitrogen (from nitride film) and silicon. Also, in order to reduce the stress of oxide encroachment at the edge of the active area and shorter oxide encroachment (or smaller bird's beak), the temperature of field oxidation and thickness of the field oxide should be optimized. In general, higher temperature and thinner field oxide are preferred for this field oxidation. The field oxidation layer is grown as shown as layer 14 in FIG. 15. Note that the field oxide layer 14 does not grow over the sandwich of layers 5/6/8/9 formed over the gate region 10, but it does grow everywhere else on the substrate 1 which is exposed.

In a fifteenth step (step 15), a field isolation implant is formed. In the active area, the field isolation implant can be blocked by the buffered nitride/CVD oxide/poly or amorphous silicon layers sandwiched on each other. In the field isolation area, the implant needs to go through the field oxide layer 14. For the separation of the n and p types of isolation implants, they can be blocked by photo resist masks. This step is the later step referred to in step 4, in which the field isolation implant can be performed when the post-gate field isolation LOCOS is formed.

For n-channel transistors on a p-silicon substrate or a p-well, a p-channel field isolation implant may need to be formed in order to provide the needed separation among all the adjacent n-channel devices. Similarly, for p-channel transistors on an n-silicon substrate or an n-well, an n-channel field isolation implant may need to be formed in order to provide the needed separation among all the adjacent p-channel devices.

A sixteenth step (step 16) is used to strip the buffered nitride layer 9 and nitride spacer 13 by a wet chemical solution. Before the layers 9 and 13 are stripped, a thin layer of oxide is formed on the nitride surface. This thin layer is formed due to the growing of the field oxidation layer 14. Another type of wet chemical may be used to remove the thin layer of oxide on the nitride surface. Without removing this thin layer of oxide, the nitride cannot be properly stripped. During the nitride removal, the wet chemical solution will not attack the poly or amorphous silicon (layer 6) due to the oxide protection from CVD oxide (layer 8) and sidewall oxide (layer 11).

A seventeenth step (step 17) is used to remove the thin layer of CVD oxide (layer 8) and sidewall oxide (layer 11) by a wet chemical solution. This wet chemical solution will not attack the edge of the gate oxide or tunnel oxide due to edge offset by field oxide encroachment, as seen in FIG. 15. After this 17th step is performed, the surface of the poly or amorphous silicon 6 is now reexposed, as seen in FIG. 16.

In an eighteenth step (step 18), another layer of poly or amorphous silicon is deposited for the purpose of interconnect, and this is shown as layer 18 in FIG. 17.

In a nineteenth (step 19), the poly or amorphous layer 18 is doped into n or p type of gate material by masks and implants, if this was not already performed in the step 7 described earlier. That is, if the poly has already been doped in the step 7, then this step is unnecessary. If layer 18 requires undoped poly or amorphous silicon, then this doping process should be performed in the step 7. If both n and p types of gates are required for the approach of self-aligned silicide gate and junction (step 25), then this doping process in the step 7 or the step 19 can be skipped, since both types of gates can be doped with source/drain junction implants together in the step 24, without the need for extra steps.

In a twentieth step (step 20), a layer of tungsten-silicide (WSi) or equivalent film is deposited on the poly or amorphous silicon layer 18 in order to reduce the resistance of the interconnect (see FIG. 17). This step can be skipped if a self-aligned silicide junction and gate are required in a later stage.

In a twentyfirst step (step 21), a gate and interconnect are defined by applying a gate mask and etch. In the active area, the source and drain will be exposed after the gate material is removed, and in the field isolation area, the etch will stop on the field oxide. The source and drain regions are on the left and right of the gate region 10, as shown in FIG. 18. FIG. 18 shows both an x-direction cross-section of the gate material sandwich of layers for the purpose of the gate itself, and a y-direction cross-section of the gate material sandwich of layers for the purpose of gate interconnect.

In a twentysecond step (step 22), N-LDD (low dose drain) and P-LDD implants are performed with masks. This step makes a very low dose junction, by first making either an n− or a p− region. The exposed silicon regions will receive the N-LDD and P-LDD implants. For a p-channel transistor, a p− low dose drain implant is made, and for an n-channel transistor, an n− low dose drain implant is made. The LDD implant regions are shown as regions 22 in FIG. 19. Note that the LDD implant regions may be implanted such that they extend underneath the region of the silicon substrate that is underneath the poly or amorphous layer 6.

Figure 19:
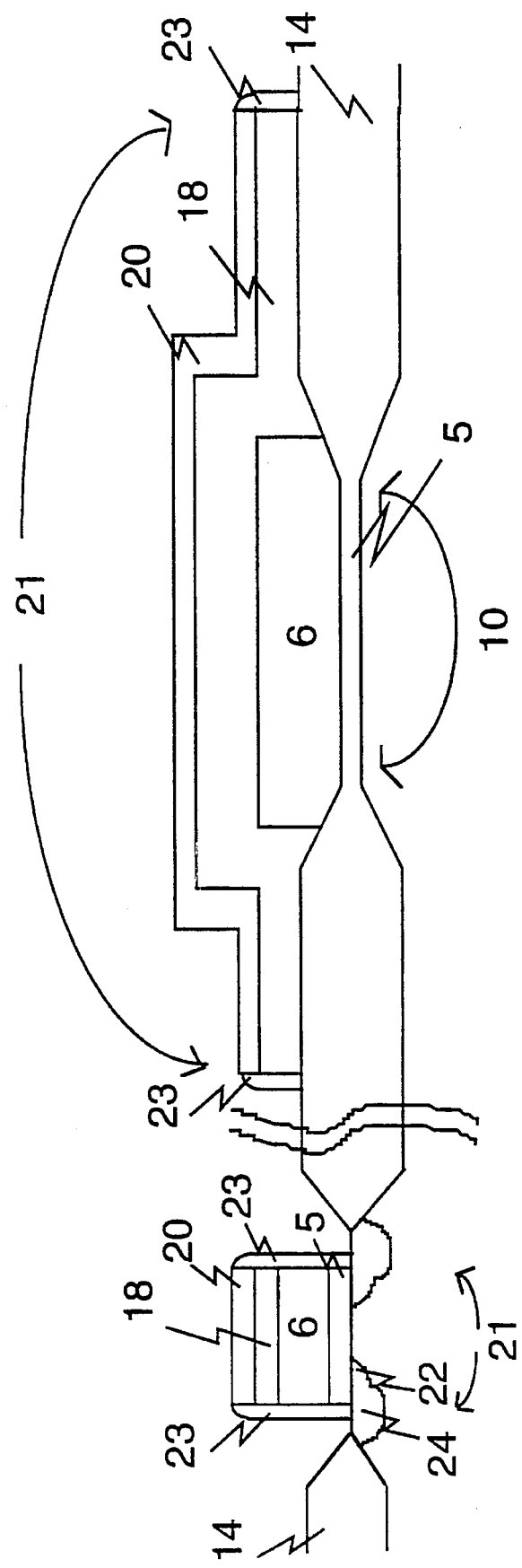
FIG. 19 shows both an x-direction cross section of the gate material sandwich and a y-direction cross section of the gate interconnect sandwich formed after the twentyfourth step in the method of the instant invention.

In a twentythird step (step 23), an oxide spacer 23 is formed with the deposition and etch of the PECVD and LPCVD oxide, as shown in FIG. 19.

In a twentyfourth step (step 24), n+ and p+ junctions are formed by separate masks and implants. (The n and p types of poly or amorphous silicon gate can be doped at the same time.) These n+ and p+ junctions are shown as regions 24 in FIG. 18. After step 22, either n− or p− implantation was performed (see regions 22). After step 24, the transistor is formed with an n+ or p+ being made offset by the oxide spacer 23 to create the n-channel or p-channel transistor, respectively. The n+ and p+ regions 24 are formed to the left and right of the gate region 10, as shown in FIG. 19.

Figure 20:
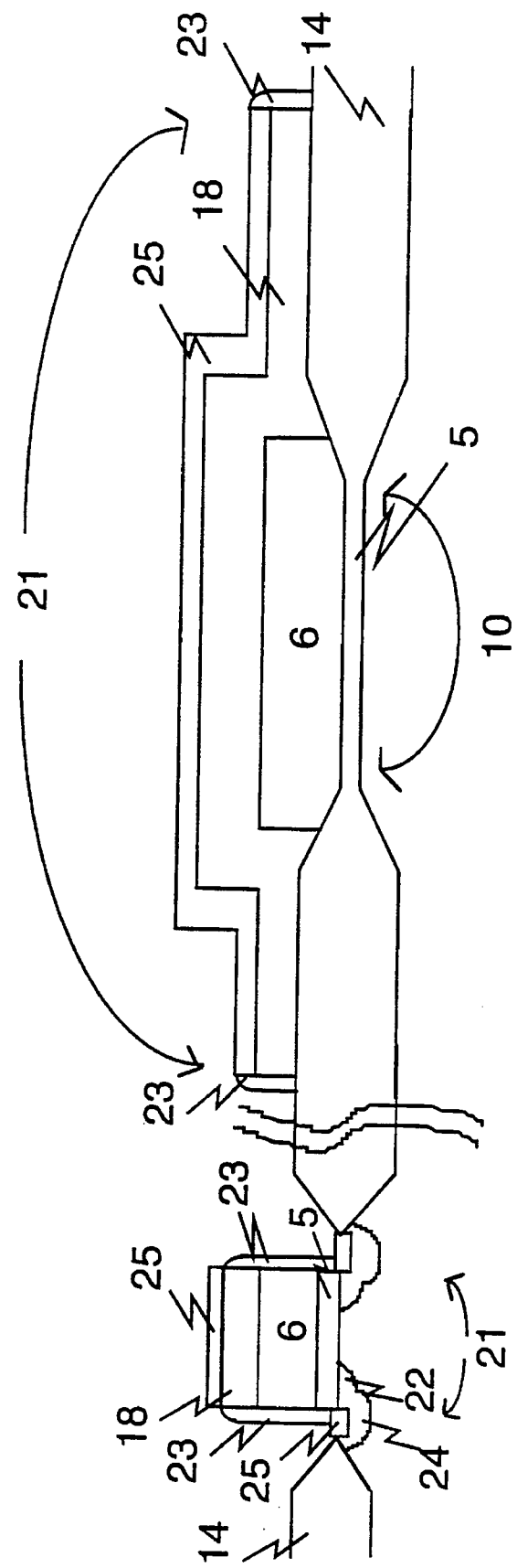
FIG. 20 shows a transistor formed after a twentyfifth step in the method of the instant invention.

In a twentyfifth step (step 25), an optional approach of a self-aligned silicide gate, junction and interconnect is formed, as shown by layer 25 in FIG. 20. A thin layer of Ti can be deposited and annealed to form silicide on the gate and junction. The Ti on the field oxide (without forming silicide) can be stripped off by wet chemical clean after the silicide anneal cycle. Note that step 20 is skipped if step 25 needs to be performed. Note that the Ti reacts with both the poly and the exposed silicon, and it forms a silicide gate, a silicide interconnect and a silicide junction as a result, as seen by the regions 25 in FIG. 20.

A twentysixth step (step 26) is used to apply a backend process with inter-layer dielectric, contacts and metals to complete the process flow. In step 26, contact holes are formed in order to connect each of the source, drain and gate regions to metals to provide the necessary external contacts for the device being configured.

While a preferred embodiment of the invention has been described herein, modification of the described embodiment may become apparent to those of ordinary skill in the art, following the teachings of the invention, without departing from the scope of the invention as set forth in the appended claims. For example, the polysilicon gate can be doped when deposited as a layer (i.e., insituly), or subsequently doped right after being deposited, or doped along with the formation of the source and the drain.

What is claimed is:

1. A method of fabricating an integrated circuit semiconductor device having a plurality of field effect transistors (FETs) in and on a silicon substrate with local oxidation of silicon (LOCOS) as field oxide isolating regions between the FETs, the method comprising the steps of:
   a) forming a gate oxide layer on a top surface of the substrate;
   b) forming a polysilicon layer on said gate oxide layer;
   c) etching said gate oxide layer and said polysilicon layer to form gate structures for said FETs;
   d) surrounding said gate structures with an oxidation mask; and
   e) forming the LOCOS field oxide isolation regions by growing an oxide layer between the FETs.

2. The method according to claim 1, further comprising the step of:
   f) forming source and drain regions for the FETs.

3. The method according to claim 1, further comprising the step of:
   d1) after performing the step d) but before performing the step e), etching areas of the top surface of the substrate which do not include said gate structures of said FETs in order to remove the oxidation mask on the etched areas.

4. The method according to claim 2, further comprising the step of:
   g) forming contacts for the source region, the drain region, and the gate structure of each FET.

5. The method according to claim 4, further comprising the step of:
   h) forming conductive lines between the contacts of each FET.

6. The method according to claim 1, wherein the polysilicon layer formed during the step b) is deposited and doped at a same time.

7. The method according to claim 1, wherein the polysilicon layer formed during the step b) is first deposited and then later doped.

8. The method according to claim 3, wherein, during the step d1), a nitride spacer is formed on opposite sides of the polysilicon layer.

9. The method according to claim 8, wherein the etching performed during the step d1) is done to the top surface of the substrate and no further.

10. The method according to claim 8, wherein the etching performed during the step d1) is done below the top surface of the substrate, thereby forming step region on opposite sides of the gate structures of the FETs.

11. A method of fabricating an integrated circuit semiconductor device having a plurality of field effect transistors (FETs) in and on a silicon substrate with local oxidation of silicon (LOCOS) as field oxide isolating regions between the FETs, the method comprising the steps of:
    a) forming a gate oxide layer on a top surface of the substrate;
    b) forming a polysilicon layer on said gate oxide layer;
    c) etching said gate oxide layer and said polysilicon layer to form gate structures for the FETs;
    d) surrounding said gate structures with an oxidation mask;
    e) etching areas of the top surface of the substrate which do not include the gate structures of said FETs such that the substrate is thicker underneath the gate structures for said FETs than it is at other areas of the substrate; and
    f) forming the LOCOS field oxide isolation regions by growing an oxide layer between the FETs.

12. The method according to claim 11, further comprising the step of:
    g) forming source and drain regions for the FETs.

13. The method according to claim 12, further comprising the step of:
    h) forming contacts for the source region, the drain region, and the gate structure of each FET.

14. The method according to claim 13, further comprising the step of:
    i) forming conductive lines between the contacts of each FET.

15. The method according to claim 11, wherein the polysilicon layer formed during the step b) is deposited and doped at a same time.

16. The method according to claim 11, wherein the polysilicon layer formed during the step b) is first deposited and then later doped.

17. The method according to claim 11, wherein, during the step e), a nitride spacer is formed on opposite sides of the polysilicon layer.

18. The method according to claim 17, wherein the etching performed during the step e) forms step regions on opposite sides of the gate structures of the FETs, and wherein the step regions are covered by the corresponding nitride spacer after the step e) is finished.

* * * * *